United States Patent [19]

Tanaka

[11] Patent Number: 4,805,230

[45] Date of Patent: Feb. 14, 1989

[54] TUNING METHOD

[75] Inventor: Yasushi Tanaka, Nagaokakyo, Japan

[73] Assignee: Mitsubhish Denki Kabushiki Kaisha, Tokyo, Japan

[21] Appl. No.: 66,246

[22] Filed: Jun. 25, 1987

[30] Foreign Application Priority Data

Jun. 25, 1986 [JP] Japan ................. 61-148806

[51] Int. Cl.$^4$ .................. H04B 11/16; H04B 1/16
[52] U.S. Cl. .................... 455/182; 455/183; 455/216; 358/191.1
[58] Field of Search ............... 455/182–186, 455/164, 165, 179, 192, 208, 209, 259, 260, 214, 216; 358/191.1

[56] References Cited

U.S. PATENT DOCUMENTS

| | | | |
|---|---|---|---|
| 4,360,832 | 11/1982 | Rzeszewski | 358/191.1 |
| 4,451,850 | 5/1984 | Kamemoto | 358/191.1 |
| 4,561,112 | 12/1985 | Ridder | 455/184 |
| 4,575,761 | 3/1986 | Carlson et al. | 358/191.1 |
| 4,590,611 | 5/1986 | Maier et al. | 455/183 |
| 4,679,246 | 7/1987 | Jeng | 455/183 |
| 4,727,591 | 2/1988 | Manlove | 455/183 |

Primary Examiner—Benedict V. Safourek
Assistant Examiner—Curtis Kuntz
Attorney, Agent, or Firm—Birch, Stewart, Kolasch & Birch

[57] ABSTRACT

In a tuning apparatus of frequency synthesizer system comprising an input circuit means including a channel switch and a shift switch, a microcomputer and a phase-locked loop circuit including a programmable divider, a method for selecting one of a plurality of television channels of different frequencies by the channel switch and adjusting the frequency of one of the television channels selected by the shift switch, which method comprises the steps of providing a first signal from the channel switch to the microcomputer, setting up the ratio of division of the programmable divider according to the first signal, providing a second signal from the shift switch to the microcomputer, varying the ratio of division of the programmable divider according to the second signal, causing the microcomputer to cyclically monitor the presence or absence of the first and second signal, and repeating said setting step when the first signal is detected as a result of the monitoring by the microcomputer, but repeating said varying step when the second signal is detected as a result of the monitoring by the microcomputer.

2 Claims, 4 Drawing Sheets

TUNING METHOD

BACKGROUND OF THE INVENTION

1. Field of the Invention

The present invention generally relates to a channel selecting circuit in a television receiver set and, more particularly, to a method for the adjustment of the frequency of a television channel in a television receiver tuning apparatus utilizing a phase locked loop (PLL) circuit.

2. Description of the Prior Art

The prior art pertinent to the present invention wil be discussed with the aid of FIG. 2 of the accompanying drawings which illustrates, in a block circuit diagram, a tuner employing a frequency synthesizer system utilizing a PLL circuit. In FIGS. 2, reference numeral 1 represents an antenna connected with a mixer 3 through an RF amplifier 2. The mixer 3 is in turn connected through an IF amplifier 4 with a video signal tuning circuit 5 (hereinafter referred to as an AFT circuit) comprised of a video signal detector and an automatic fine tuning (AFT) circuit 5, which AFT circuit 5 is in turn connected through a signal processing circuit 6 with a cathode ray tube 7 or any other suitable display unit. Reference numeral 8 represents a local oscillator, reference numeral 9 represents a programmable frequency divider, reference numeral 10 represents a phase comparator, reference numeral 11 represents a low pass filter, reference numeral 12 represents a microcomputer, reference numeral 13 represents a phase locked loop (PLL) circuit, reference numeral 14 represents a sync signal detecting circuit, reference numeral 15 represents an analog-to-digital (A/D) converter, reference numeral 16 represents a keyboard input circuit, an reference numeral 17 represents a keyboard having tens keys. In FIG. 3 reference numeral 18 represents channel up-shift and down-shift keys, reference numeral 19 represents a mode selector switch assembly including, among other switches, an automatic fine tuning (AFT) switch 19a, and reference numeral 20 represents fine frequency adjusting keys.

The system is so designed as to operate in the following manner. The keyboard input circuit 16 is comprised of, as best shown in FIG. 3, a keyboard matrix circuit connected with input and output ports of the microcomputer 12.

The operation which takes place when the AFT switch 19a is closed, that is, the automatic tuning operation, will now be described with reference to FIG. 2 and also to a flowchart shown in FIG. 4.

Assuming that the AFT switch 19a is closed and a certain channel is subsequently selected by the manipulation of one of the tens keys 17 or one of the channel up-shift and down-shift keys 18, the microcomputer 12 reconstructs the channel number allocated to the channel selected and calculates a data N (division ratio) for the programmable frequency divider 9 which corresponds to the frequency allocated to each channel, the microcomputer 12 subsequently setting the programmable divider 9 to the data N. The phase locked loop circuit 13 comprised of the programmable divider 9, the phase comparator 10, the low pass filter, and the local oscillator 8 is so locked as to cause the local oscillator 8 to oscillate at a frequency equal to a predetermined frequency set for the selected channel. On the other hand, a television signal received at the antenna 1 and amplified by the RF amplifier 2 is mixed at the mixer 3 with the output signal from the local oscillator 8, and then the IF amplifier 4 amplifies the mixed signal which is in turn applied to the AFT circuit 5 at which the frequency of the received signal applied from the IF amplifier 4 is discriminated. After the discrimination of the frequency of the received signal, the AFT circuit 5 outputs an AFT voltage varying so as to depict a curve generally similar to the shape of a figure "S" (i.e., the voltage abruptly increasing in the vicinity of a certain frequency and then decreasing), the detected signal being, after having been processed in the signal processing circuit 6, applied to the cathode ray tube 7 for the reproduction of a color television picture.

On the other hand, the AFT voltage outputted from the AFT circuit 5 is also supplied to the microcomputer 12 through the A/D converter 15 and is then compared with a predetermined voltage to determine if the AFT voltage is within a predetermined range. If the AFT voltage so compared is within the predetermined range, the automatic tuning operation is completed.

However, if the AFT voltage is not within the predetermined range, a decision is then made to determine whether the AFT voltage is higher than the predetermined range or whether the AFT voltage is lower than the predetermined range. In the event that the AFT voltage is higher than the predetermined range, the preset data N of the programmable divider 9 is incremented by $\Delta N$ so that the oscillating frequency of the local oscillator 8 can be increased by $\Delta f$. On the other hand, in the event that the AFT voltage is lower than the predetermined range, the preset value N of the programmable frequency divider 9 is decremented by $\Delta N$ so that the oscillating frequency of the ocal oscillator 8 can be decreased by $\Delta f$. This program flow is repeated until the AFT voltage falls within the predetermined range, thereby completing the automatic tuning operation wherefore a television receiver set receives the transmitted television signal at a frequency appropriate for the AFT voltage to fall within the predetermined range.

It is, however, to be noted that during this automatic tuning operation the fine frequency adjusting keys 20 do not work.

The manual tuning operation which is carried out during the opening of the AFT switch 19a will now be described with reference to FIG. 2 and also to a flowchart shown in FIG. 5.

Until the programmable divider 9 is set to the data N of the selected channel, the program flow proceeds in a manner similar to the automatic tuning operation shown in and described with reference to FIG. 4, even during the manual tuning operation, and, accordingly, the television receiver set is placed ready to receive the television signal at a frequency equal to a predetermined frequency oscillated by the local oscillator 8. However, when any one of the +F or −F fine tuning keys 20 is closed, a decision is then made to determine which one of the tuning keys 20 has been closed. If the fine tuning key 20 is the +F tuning key, the data N is incremented by $\Delta N$, but if it is the −F tuning key, the data N is decremented by $\Delta F$. A viewer of the television receiver set depresses either the +F tuning key or the −F tuning key through a number of times required to permit the television receiver to be in condition ready to receive the desired channel, thereby completing the manual tuning operation.

The prior art apparatus so constructed as hereinabove discussed is such that, when one of the automatic tuning mode and the manual tuning mode is selected, the microcomputer executes one of the program flows shown respectively in FIGS. 4 and 5, which is appropriate to the selected mode. Accordingly, where a fine frequency adjustment is desired to be effected even after a particular channel has been properly selected under the automatic tuning mode, depending on the source of the signal desired to be received and/or the intensity of the electric field of the signal of the selected channel, the automatic tuning mode is required to be switched over to the manual tuning mode in which the frequency being received can be manually adjusted to the frequency allocated to the selected channel in readiness for the manual tuning operation to be carried out by manipulating one of the fine tuning keys 20 to place the television receiver set in condition to receive the proper frequency. Thus, with the apparatus according to the prior art, the fine frequency adjustment requires relatively complicated and time-consuming procedures.

SUMMARY OF THE INVENTION

Accordingly, the present invention has been devised with a view to substantially obviating the above discussed disadvantages and inconveniences inherent in the prior art apparatus and has for its principal object to provide an improved tuning method and an improved tuning apparatus wherein, during the automatic tuning mode, the frequency of the selected television channel can be finely adjusted, irrespective of the predetermined range of the AFT voltage, in dependence on the manipulation of the fine tuning key so that, each time the particular television channel is selected, automatic tuning to the frequency of the selected television channel can be accomplished.

In order to accomplish the above described object, the present invention provides a tuning apparatus of frequency synthesizer system comprising an input circuit means including a channel switch and a shift switch, a microcomputer, a phase-locked loop circuit means including a programmable divider, which apparatus performs a method comprising the steps of providing a first signal from the shift switch to the microcomputer, setting up the ratio of division of the programmable divider according to the first signal, providing a second signal from the shift switch to the microcomputer, varying the ratio of division of the programmable divider according to the second signal, causing the microcomputer to cyclically monitor the presence or absence of the first and second signals, and repeating said setting up step when the first signal is detected as a result of the monitoring by the microcomputer, but repeating said varying step when the second signal is detected as a result of the monitoring by the microcomputer.

The channel switch may be comprised of tens keys, and channel up-shift and down-shift keys, while the shift switch may be comprised of fine frequency adjusting keys.

BRIEF DESCRIPTION OF THE DRAWINGS

In any event, the present invention will become more clearly understood from the following detailed description of a preferred embodiment thereof, when taken in conjunction with the accompanying drawings. However, the embodiment and the drawings are given for the purpose of illustration and explanation only, and are not to be taken as being limitative of the present invention in any way whatsoever, whose scope is to be determined solely by the appended claims. In the drawings:

DETAILED DESCRIPTION OF THE PREFERRED EMBODIMENT

Figure 1:
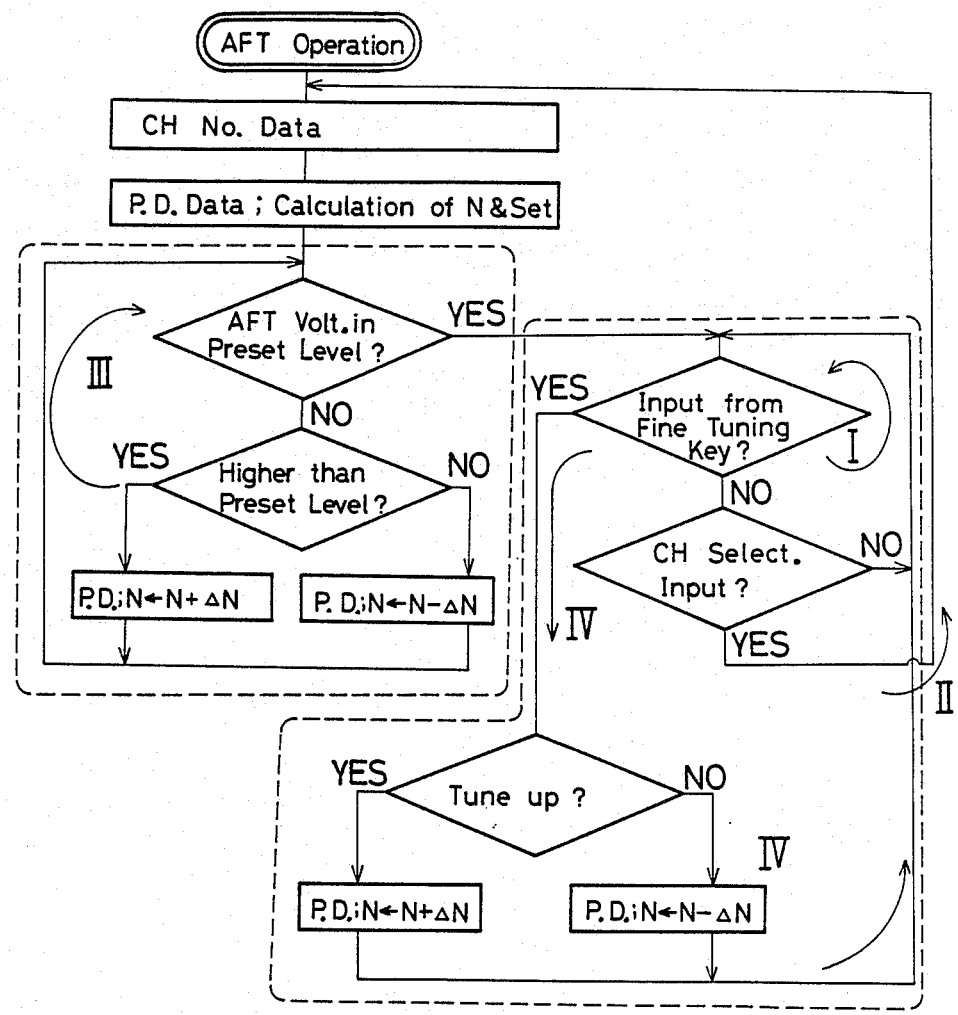
FIG. 1 is a flowchart showing the sequence of operation of a microcomputer, used in a television receiver tuning apparatus, according to the present invention.
Figure 2:
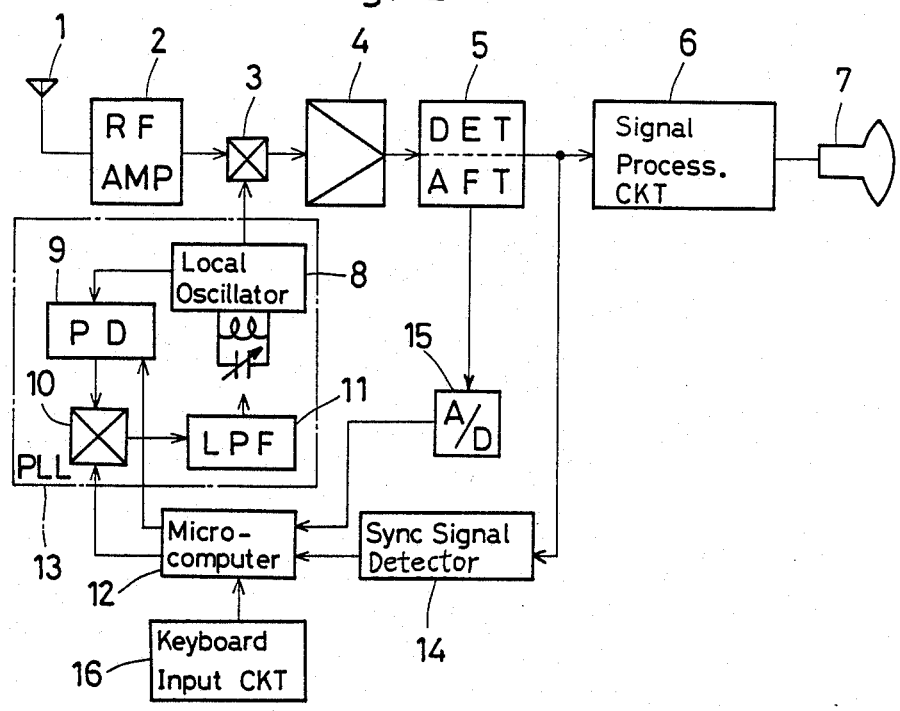
FIG. 2 is a block circuit diagram of the television receiver tuning apparatus of frequency synthesizer system utilizing a phase-locked loop circuit.
Figure 3:
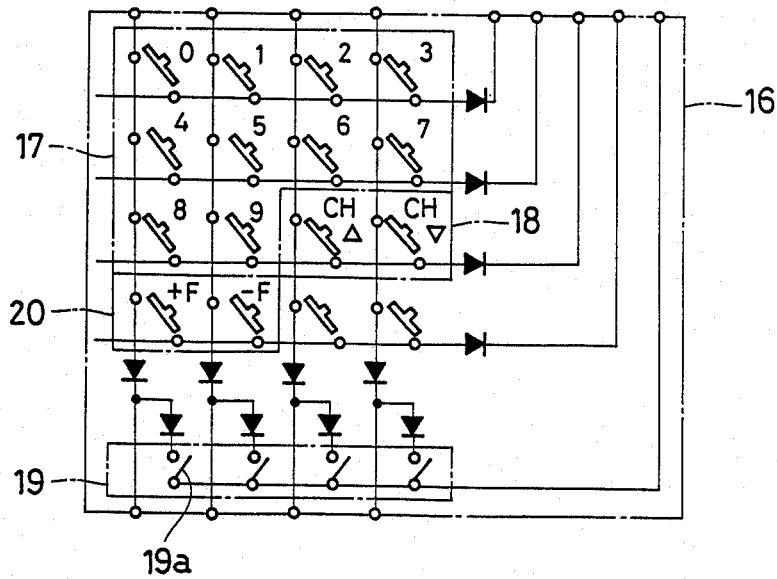
FIG. 3 is a diagram showing a keyboard matrix input circuit.

Referring to FIGS. 1 and 3, a preferred embodiment of the present invention will now be described. In this embodiment, the following four flows are executed by the microcomputer 12.

[Flow I]

Under the condition in which a normal tuning operation has been completed, the presence or absence of an input from one of the fine tuning keys 20 and the presence or absence of a tuning manipulation are checked, and in the event that neither the input from any one of the fine tuning keys 20 nor a tuning manipulation occur, a television receiver set is held in a condition then receiving the frequency of a television channel.

[Flow II]

In the event that a tuning input through the ten keys 17 occurs while no signal from any one of the fine tuning keys 20 is applied, the following flow III is executed.

[Flow III]

Figure 4:
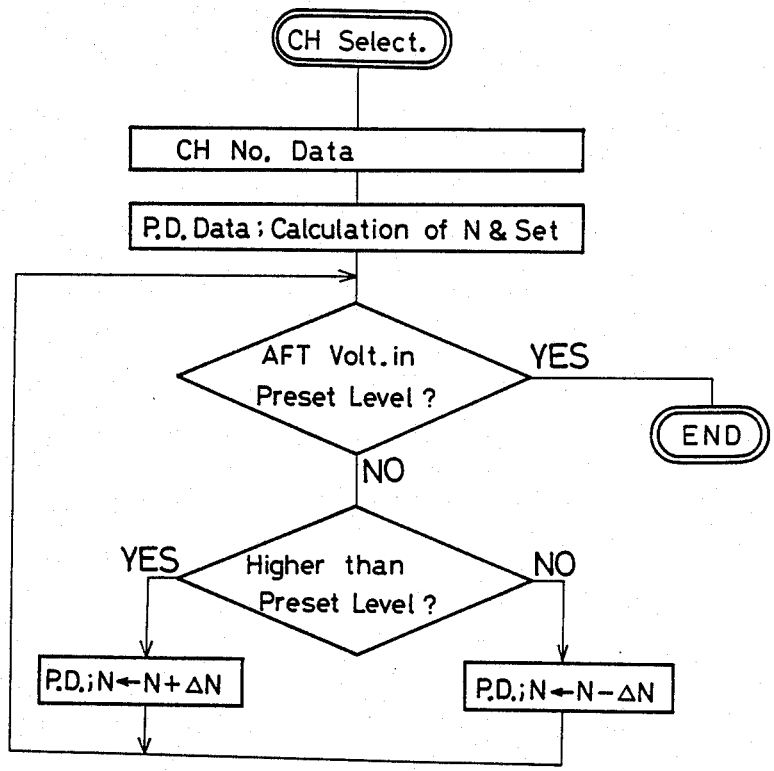
FIG. 4 is a flowchart showing the sequence of operation during an automatic tuning mode according to a prior art tuning method.
Figure 5:
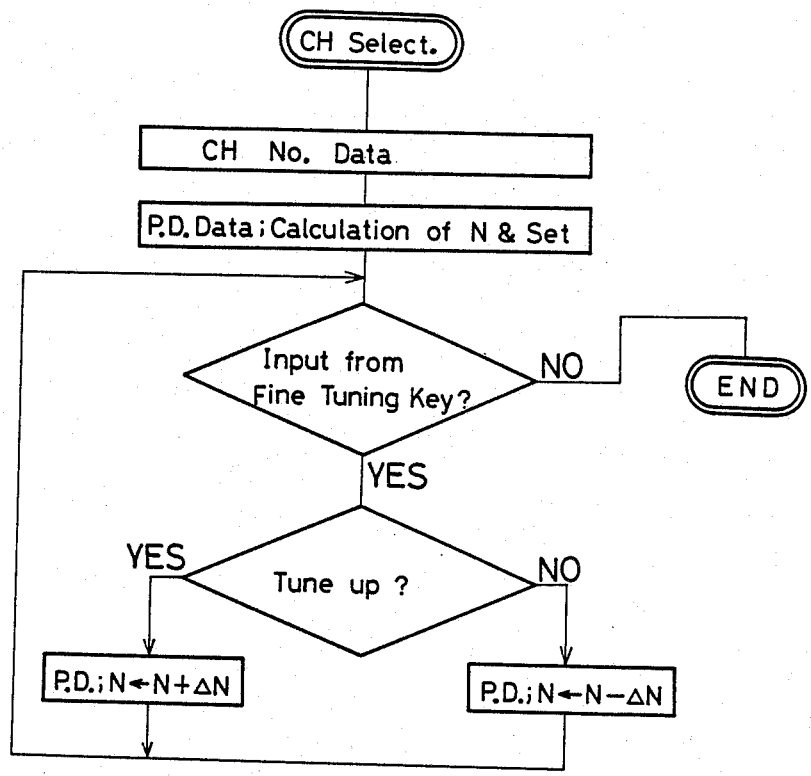
FIG. 5 is a flowchart showing the sequence of operation during a manual tuning mode according to the prior art tuning method.

The flow III is identical with the automatic tuning operation performed by the prior art apparatus as shown in FIG. 4. During the execution of the flow III, an operation of increasing or decreasing the oscillating frequency of the local oscillator is carried out followed by a return to flow I.

[Flow IV]

In the event of the presence of the input from one of the fine tuning keys 20, an adjustment for incrementing or decrementing the oscillating frequency of the local oscillator 8 by $\Delta f$ according to a flow identical with the flow for the manual tuning operation performed by the prior art apparatus is carried out at a predetermined interval during the presence of the input from one of the fine tuning keys 20, and the flow I is resumed when no input is applied from any one of the fine tuning keys 20.

As hereinbefore described, according to the embodiment of the present invention, once the channel selection is carried out the channel selection is accomplished under the automatic tuning mode and the frequency of the local oscillator 8 can be varied by a desired amount, the manual tuning operation can readily be achieved in a simplified manner requiring no switching over to the manual mode. Thus, since the oscillating frequency of the local oscillator 8 can be shifted up or down by the manipulation of any one of the fine tuning keys 20, the fine adjustment of the frequency being received by the television receiver set can be readily accomplished in a simplified manner.

Although the present invention has been fully described with reference to the accompanying drawings in connection with the preferred embodiment thereof taken only for the purpose of illustration, various changes and modifications can readily be conceived by those skilled in the art upon the reading of the disclosure herein made. Accordingly, such changes and modifications are to be construed as included within the scope of the present invention as defined by the appended claims unless they depart therefrom.

I claim:

1. A method for selecting one of a plurality of television channels of different frequencies by a channel switch and adjusting the frequency of the channel selected by a shift switch, comprising the steps of:
    (a) generating and coupling a first signal from the channel switch to a microcomputer in a tuning apparatus employing a frequency synthesizer system having a phase-locked loop circuit means including a programmable frequency divider;
    (b) setting-up a division ratio of the programmable frequency divider in response to the first signal by said microcomputer;
    (c) generating and coupling a second signal from the shift switch to the microcomputer;
    (d) varying the division ratio of the programmable divider in response to the second signal by said microcomputer;
    (e) cyclically monitoring the presence or absence of the first and second signal by said microcomputer;
    (f) repeating said setting-up step (b) when the first signal is detected as a result of said monitoring step
    (e) and repeating said varying step (d) when the second signal is detected as a result of said monitoring step (e); and
    wherein said setting-up step (b) further comprises,
        a first step of calculating the division ratio in accordance with the first signal,
        a second step of programming the calculated division ratio into the programmable frequency divider,
        a third step of comparing a voltage corresponding to the frequency of the received channel with a predetermined level,
        a fourth step of increasing the division ratio when the compared voltage is higher than the predetermined level, and
        a fifth step of decreasing the division ratio when the compared voltage is lower than the predetermined value.

2. A method for selecting one of a plurality of television channels of different frequencies by a channel switch and adjusting the frequency of the channel selected by a shift switch, comprising the steps of:
    (a) generating and coupling a first signal from the channel switch to a microcomputer in a tuning apparatus employing a frequency synthesizer system having a phase-locked loop circuit means including a programmable frequency divider;
    (b) setting up a division ratio of the programmable frequency divider in response to the first signal by said microcomputer;
    (c) generating and coupling a second signal from the shift switch to the microcomputer;
    (d) varying the division ratio of the programmable divider in response to the second signal by said microcomputer;
    (e) cyclically monitoring the presence or absence of the first and second signal by said microcomputer;
    (f) repeating said setting up step (b) when the first signal is detected as a result of said monitoring step
    (e) and repeating said varying step (d) when the second signal is detected as a result of said monitoring step (e); and
    wherein said repeating step (f) further comprises,
        a first step of cyclically monitoring the second signal while the tuning apparatus is in a channel receiving condition as a result of the setting-up step (b), and again performing the varying step (d) when the second signal is detected, and
        performing a second step in the event the second signal is not detected, said second step comprising monitoring the first signal and performing said setting-up of step (b) when the first signal is detected, but repeating said first step while the above-mentioned condition is maintained in the event that the first signal is not detected.

* * * * *